United States Patent [19]

Miller

[11] 4,079,457

[45] Mar. 14, 1978

[54] CURRENT MODE BINARY/BCD ARITHMETIC LOGIC UNIT WITH PARITY

[75] Inventor: Homer Warner Miller, Peoria, Ariz.

[73] Assignee: Honeywell Information Systems Inc., Phoenix, Ariz.

[21] Appl. No.: 756,460

[22] Filed: Jan. 3, 1977

[51] Int. Cl.² .............................................. G06F 11/10
[52] U.S. Cl. .................................................. 364/738
[58] Field of Search ................................. 235/153 BB

[56] References Cited

U.S. PATENT DOCUMENTS

| | | | |
|---|---|---|---|
| 3,758,760 | 9/1973 | Cowan | 235/153 BB |
| 3,925,647 | 12/1975 | Louie | 235/153 BB |
| 3,958,112 | 5/1976 | Miller | 235/174 |
| 3,986,015 | 10/1976 | Gooding | 235/153 BB |

OTHER PUBLICATIONS

Hsiao & Wolff, "High-Speed, Self-Checked, BCD Adder" *IBM Tech. Disclosure Bulletin*, vol. 14, No. 12, May 1962, pp. 59–61.

*Primary Examiner*—David H. Malzahn
*Attorney, Agent, or Firm*—William H. Holloway, Jr.; Ronald T. Reiling; Nicholas Prasinos

[57] ABSTRACT

An improved binary/binary coded decimal arithmetic logic unit employing soft-saturating current mode logic gates operates on pure binary data or binary coded decimal (BCD) data. The unit performs 16 binary and 2 decimal arithmetic operations and 16 Boolean operations on two 4-bit plus parity input fields. The particular operation is determined by a 5-bit mode control signal. A carry-in input CIN, duplicate carry-in input CIND, parity check PCK input, invert parity input IP, decimal mode signal D, and decimal add input DA are also provided. The device generates a binary output resultant of the operation defined by the mode control signal. In addition to the arithmetic or logic operations, the unit performs parity checking, parity carry, and parity prediction operations on 4-bit plus parity binary and BCD fields.

2 Claims, 27 Drawing Figures

CURRENT MODE BINARY/BCD ARITHMETIC LOGIC UNIT WITH PARITY

CROSS-REFERENCE TO RELATED INVENTIONS

1. Current Mode Carry Look Ahead Array invented by Homer W. Miller, now issued as U.S. Pat. No. 3,925,652 and assigned to the same assignee as the instant invention.
2. Magnitude Comparison Circuit invented by Homer W. Miller, now issued as U.S. Pat. No. 3,955,177 and assigned to the same assignee as the instant invention.
3. Current Mode Arithmetic Logic Array invented by Homer W. Miller, now issued as U.S. Pat. No. 3,925,651 and assigned to the same assignee as the instant invention.
4. Current Mode Binary (BCD) Arithmetic Array invented by Homer W. Miller, now issued as U.S. Pat. No. 3,958,112 and assigned to the same assignee as the instant invention.
5. Data Alignment Circuit invented by Darrell L. Fett, now issued as U.S. Pat. No. 3,967,101 and assigned to the same assignee as the instant invention.
6. Selector Latch Gate invented by Darrell L. Fett, now issued as U.S. Pat. No. 3,953,746 and assigned to the same assignee as the instant invention.
7. N-Bit Register System Using CML Circuits invented by Darrell L. Fett, now issued as U.S. Pat. No. 3,984,702 and assigned to the same assignee as the instant invention.
8. High-Speed Random Access Memory invented by Darrell L. Fett, now issued as U.S. Pat. No. 3,916,394 and assigned to the same assignee as the instant invention.
9. Multiple-Generating Register invented by Darrell L. Fett, now issued as U.S. Pat. No. 3,949,209 and assigned to the same assignee as the instant invention.
10. Multiple-Generating Register invented by Jerome L. Kindell, bearing Ser. No. 642,845, filed Dec. 22, 1975, now issued as U.S. Pat. No. 4,034,198, and assigned to the same assignee as the instant invention.
11. Current Mode Arithmetic Logic Circuit With Parity Prediction and Checking invented by Homer W. Miller bearing Ser. No. 756,457, filed Jan. 3, 1977, and assigned to the same assignee as the instant invention.
12. Current Mode 5-Bit Arithmetic Logic Unit With Parity invented by Homer W. Miller bearing Ser. No. 756,456, filed Jan. 3, 1977, and assigned to the same assignee as the instant invention.
13. Current Mode Multiple-Generating Register invented by Homer W. Miller bearing Ser. No. 756,465, filed Jan. 3, 1977, and assigned to the same assignee as the instant invention.
14. Current Mode Simultaneous Dual-Read/Single-Write Memory Device invented by Darrell L. Fett bearing Ser. No. 756,466, filed Jan. 3, 1977, and assigned to the same assignee as the instant invention.
15. Current Mode 4-Bit Arithmetic Logic Unit With Parity invented by Homer W. Miller bearing Ser. No. 756,458, filed Jan. 3, 1977, and assigned to the same assignee as the instant invention.
16. 5-Bit 1-of-4 Gated Select Circuit Utilizing Current Mode Logic invented by Homer W. Miller bearing Ser. No. 756,464, filed Jan. 3, 1977, and assigned to the same assignee as the instant invention.
17. 17-Bit Equality Comparator Utilizing Current Mode Logic invented by Homer W. Miller bearing Ser. No. 756,459, filed Jan. 3, 1977, and assigned to the same assignee as the instant invention.
18. J-K Flip-Flop Utilizing Current Mode Logic With Non-Functional Test Capability invented by Homer W. Miller bearing Ser. No. 756,461, filed Jan. 3, 1977, and assigned to the same assignee as the instant invention.
19. 4-Bit Counter/Shift Register Utilizing Current Mode Logic invented by Homer W. Miller bearing Ser. No. 756,463, filed Jan. 3, 1977, and assigned to the same assignee as the instant invention.
20. 10-Bit D-Type Register Utilizing Current Mode Logic invented by Homer W. Miller bearing Ser. No. 756,462, filed Jan. 3, 1977, and assigned to the same assignee as the instant invention.

BACKGROUND OF THE INVENTION

This invention relates generally to digital logic circuitry and, more particularly, to an improved current mode binary/binary coded decimal arithmetic logic unit which performs parity checking, parity carry, and parity prediction operations.

Various binary/binary coded decimal arithmetic logic units are known in the prior art. The above-referenced Current Mode Binary/BCD Arithmetic Array is directed to a binary/binary coded decimal arithmetic logic unit which performs the basic arithmetic and logic operations of the present invention. The improved current mode binary/binary coded decimal arithmetic logic unit of the present invention provides, in addition to the basic arithmetic and logic functions, necessary and useful parity prediction and parity checking operations on 4-bit plus parity binary and BCD fields. Consequently, errors generated within the arithmetic logic unit or generated during the transmission of data to such unit will be detected quite early in the processing operation, resulting in an overall savings of processing time.

OBJECTS OF THE INVENTION

It is therefore an object of the present invention to provide an improved current mode binary/binary coded decimal arithmetic logic unit.

It is also an object of the present invention to provide an improved current mode binary/binary coded decimal arithmetic logic unit which performs parity prediction operations on binary and BCD fields.

It is yet another object of the present invention to provide an improved current mode binary/binary coded decimal arithmetic logic unit which performs parity checking operations on binary and BCD fields.

It is a further object of the present invention to provide an improved current mode binary/binary coded decimal arithmetic logic unit which performs carry checking operations on binary and BCD fields.

These and other objects of the invention are achieved in accordance with a preferred embodiment of the invention by providing an improved current mode binary/binary coded decimal arithmetic logic unit comprising a logic portion including a half-adder and circuitry performing other logic functions on two 4-bit sets of data inputs, a carry look-ahead portion, and a half-sum and carry portion. In addition to the two 4-bit sets of inputs, a 5-bit mode control signal is received as an input for determining the particular arithmetic or logic function to be performed on the input data. A carry input is also provided. In order to perform the parity prediction and checking operations, an invert parity input, a carry-in duplicate input, and a parity check signal are provided.

In order to facilitate arithmetic operations on BCD data, circuitry is provided to add 6 to one set of data inputs for BCD addition. The excess 6 is required to generate a carry when the sum reaches or exceeds 10, as opposed to the carry generate at level 16 for 4-bit binary data. Further, the operation output is processed by another circuit which is responsive to a BCD addition or substraction operation to subtract 6 from the output if the operation does not generate a carry.

The unit generates a 4-bit plus parity output and carryout signal. In addition a propogate signal and a generate signal are provided for utilization when the device is connected to a Carry-Look-Ahead Array of the type referenced above. Further, an output error signal is generated when either a carry error or a half-sum parity error is detected.

Importantly, each portion of the arithmetic logic unit is implemented using soft-saturating current mode series gates as basic circuit elements.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

FIGS. 5a–14a show various logic symbols appearing in FIGS. 2A–2C, 3A, and 3B.

FIGS. 5b–14b show detailed circuit schematics for performing the logic functions represented by the logic symbols shown in FIGS. 5a–14a.

DETAILED DESCRIPTION OF THE INVENTION

Figure 1:
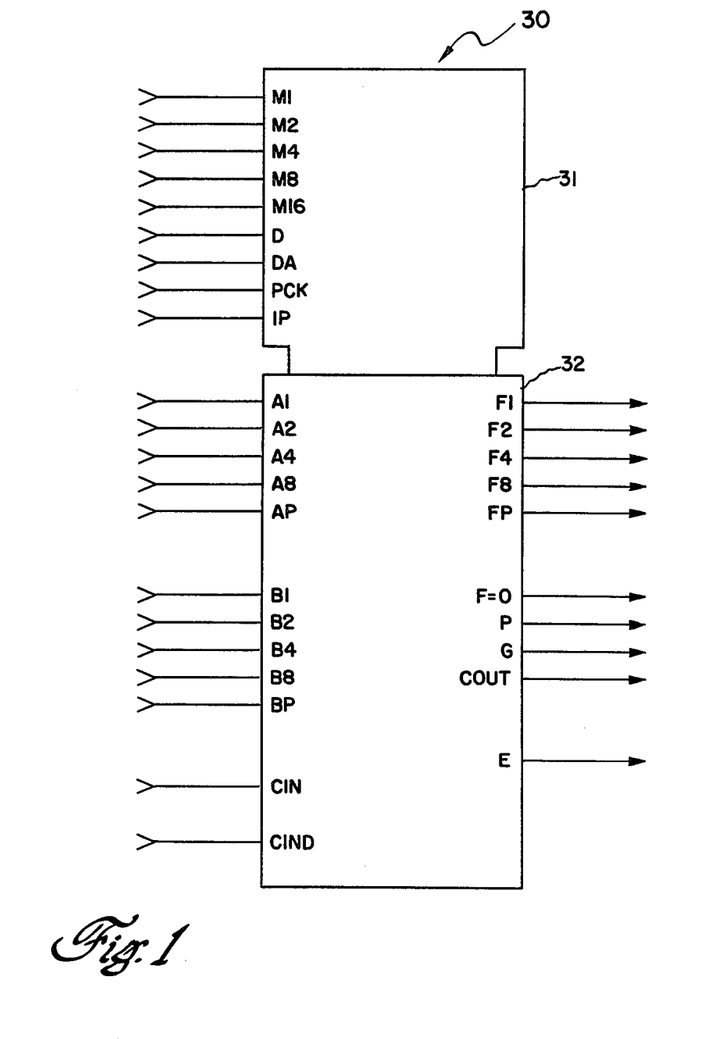
FIG. 1 shows a symbolic representation of the current mode binary/binary coded decimal arithmetic logic unit with parity including the various inputs thereto and the outputs therefrom, of the present invention.

FIG. 1 is a symbolic representation of the current mode binary/binary coded decimal arithmetic logic unit with parity, including the various inputs thereto and outputs therefrom, of the present invention. The binary/binary coded decimal arithmetic logic unit 30 comprises a control portion 31 and an input/output portion 32. Control portion 31 receives a 5-bit mode control signal M1–M16 for prescribing the particular arithmetic or logic operation to be performed. A decimal mode signal D is used to enable the decimal mode of operation. A decimal arithmetic operation control signal DA is used to enable decimal add or decimal subtract functions. A parity check control signal PCK is used to enable a halfsum parity check. The PCK signal is normally in the true state, unless the input data does not contain parity bits and only parity prediction is desired. An invert parity input IP is used to enable an operation whereby the binary output parity bit FP is inverted for the purpose of testing down-stream parity checking circuits when the device of the present invention is utilized in conjunction with additional circuitry.

The input/output portion 32 receives inputs two 4-bit plus parity input fields A1–A8 plus AP and B1–B8 plus BP. In addition, the input/output portion 32 receives a carry-in input signal CIN and a carry-in duplicate signal CIND. The input/output portion 32 generates a binary output F1"F8 plus parity bit FP in accordance with the particular arithmetic or logic function defined by the mode control signal M1–M16. In addition, portion 32 provides a zero-valued output signal F=0. Furthermore, portion 32 produces a propogate signal P, a generate signal G, and a carry out signal COUT which are utilized when the device is used in combination with other arrays and in particular where the unique Carry-Look-Ahead Array referenced above is utilized. Finally, an output error signal E is generated when either a carry error or a halfsum parity error is detected by the internal circuitry of the device.

As stated above, the current mode binary/binary coded decimal arithmetic logic unit with parity employs soft-saturating current mode logic gates including several basic circuit components, which individual circuit components are illustrated in FIGS. 5–14. In these figures the logic symbol is illustrated together with a detailed schematic of the equivalent electrical circuit. The logic circuitry includes a lower level gate and an upper level gate which in combination have an output voltage swing of only approximately 0.5 V. This limited voltage swing reduces the power requirements and reduces the transition times.

Figure 5A:
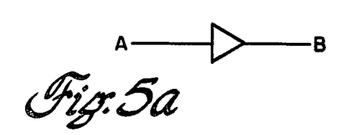
Figure 5B:
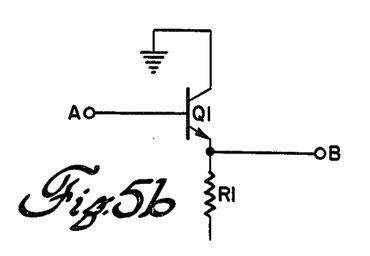

FIG. 5a is the symbol for an emitter follower having an input A and an output B. This is used in the present invention primarily as a voltage translator, shifting the voltage applied at input A down by 0.8 V at the output B. FIG. 5b shows the equivalent electrical circuit, wherein input A is applied to the base of transistor Q1, and output B is taken at the common terminal of resistor R1 and the emitter of transistor Q1.

Figure 6A:
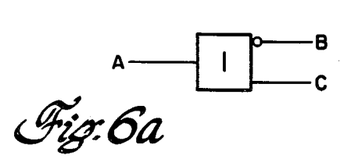
Figure 6B:
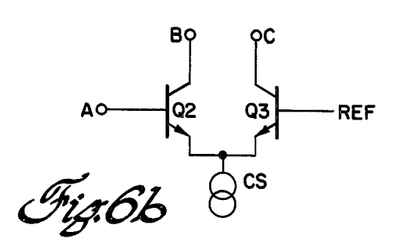

FIGS. 6a–8a illustrate the symbol for a lower level gate, which may be implemented in any of the three ways illustrated in FIGS. 6b–8b, depending upon whether the outputs of the lower level gate drive an upper level gate or not. The lower level gate has an input A, a true output C and a complement output B. In FIG. 6b the A input is applied to the base of transistor Q2, and a reference voltage of −1.06 V is applied to the base of transistor Q3. The true or C output is taken from the collector terminal of transistor Q3, and the complement or B output is taken from the collector of transistor Q2. With NPN bipolar transistors a binary 0 at input A in the form of a 0 V signal causes conduction in transistor Q2 and non-conduction in transistor Q3, so that a binary 0, representing the absence of current, is generated over the C output, and a binary 1 representing the presence of current, appears at the B output. Conversely, a binary 1 at input A renders transistor Q2 non-conductive and transistor Q3 conductive, thereby generating a binary 0 at output B and a binary 1 at output C. When either or both of the outputs B and C of the lower level gate are used to drive an upper level gate, such as that illustrated in FIGS. 10, 11, or 13, the resistor is eliminated from the corresponding leg of the output portion of the lower level gate. Thus, the circuit illustrated in FIG. 6, whose outputs are both used to drive upper level gates, has no resistors in the output legs. Since neither of the outputs of the circuit shown in FIG. 7b is used to drive an upper level gate, resistors R4 and R5 appear in both output legs of the circuit. Regarding the cicuit shown in FIG. 8b, the B output drives an upper level gate, whereas the C output does not drive an upper level gate.

Figure 9A:
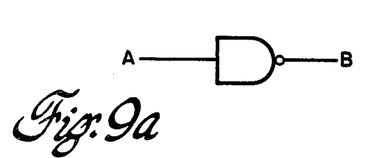
Figure 9B:
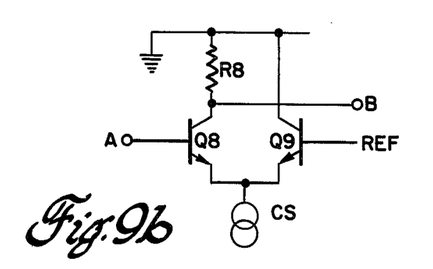

FIG. 9a shows the logic symbol for an inverter having an input A and an inverting output B. Referring to FIG. 9b, when a binary 1 in the form of a 0.5 V signal (assuming a negative logic convention) appears on input A at the base of transistor Q8, Q8 is turned off, and a 0 V signal representing a binary 0 appears at the output B. Conversely, when input A is a binary 0, Q8 turns on, and the voltage at output B is −0.5 V representing a binary 1.

Figure 10A:
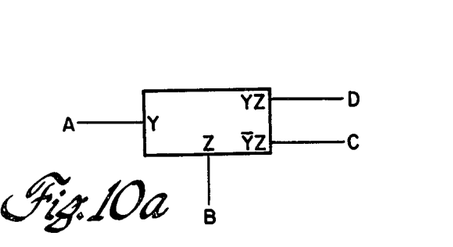

FIG. 10a shows the symbol for a 2-input upper level gate having inputs A and B applied to input terminals Y and z, respectively, and producing Y.Z and $\overline{Y}$.Z outputs at output terminals D and C, respectively. In the equivalent electrical schematic of FIG. 10b input A is applied to the base of transistor Q10, and input B is applied to the common terminal of the emitters of transistors Q10 and Q11. A reference voltage of −0.26 V is applied to the base of transistor Q11, and the collectors of transistors Q10 and Q11 are connected through resistors R10 and R11, respectively, to ground. The C output is taken at the collector of transistor Q10, and the D output is taken at the collector of transistor Q11.

Figure 11A:
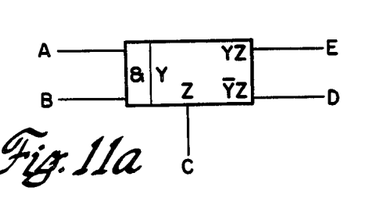

The upper level gate shown in FIG. 11a is similar in function to that shown in FIG. 10a, the Y input here being the AND function of inputs A and B and the input again being the C input. Thus, output e equals A.B.C. and output D equals $\overline{A.B}$.C. With reference to the equivalent electrical schematic shown in FIG. 11b, the A and B inputs are applied to the bases of transistors Q13 and Q12, respectively, the C input is applied to the common terminal of the emitters of transistors Q12–Q14, the D output is taken at the common terminal of the collectors of transistors Q12 and Q13, and the E output is taken at the collector of transistor Q14. For current to flow through the E output, inputs A and B must both be a binary 1 in the form of a −0.5 V signal, thus rendering transistor Q14 conductive and input C must be present. Otherwise, if either of the A or B inputs are a binary 0 (OV) and the C input is present, current will flow through output terminal D.

Figure 7A:
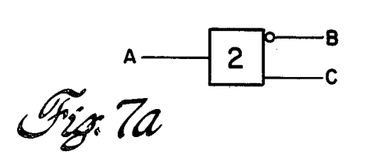
Figure 7B:
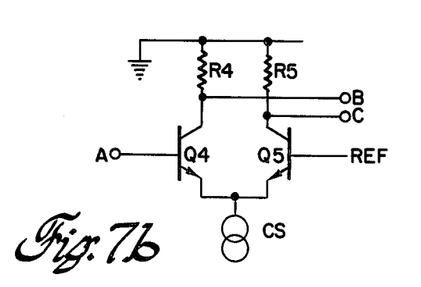
Figure 8A:
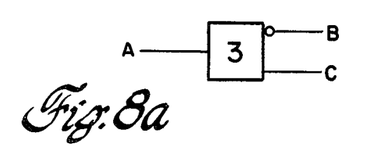
Figure 8B:
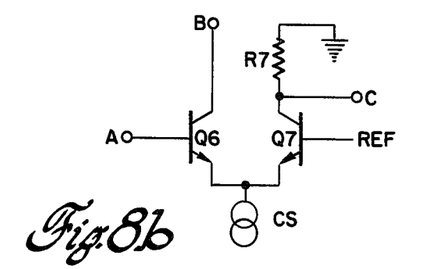
Figure 10B:
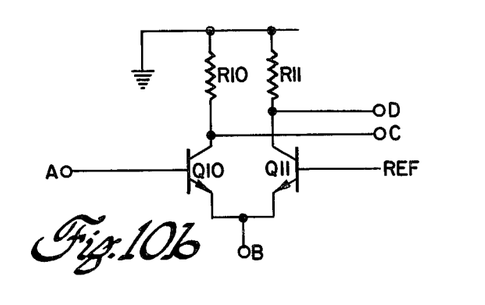
Figure 11B:
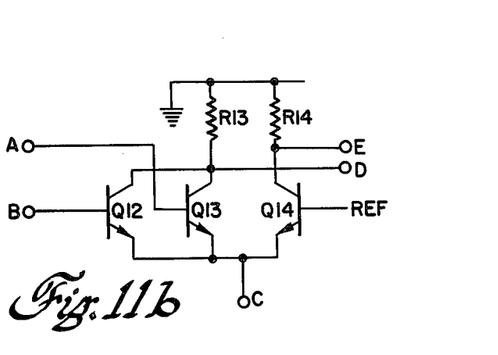

The upper level gate of FIGS. 10 and 11 are used in combination with the lower level gates shown in FIGS. 6–8. As described previously, the reference voltage for the upper level gates is −0.26 V and the logic inputs are either 0V or −0.5V. The output voltage swings between 0 and −0.5V. Since the inputs to the lower level gates are derived from emitter followers, the consequent 0.8 V voltage translation necessitates a reference voltage of −1.06V for the lower level gates.

Figure 12A:
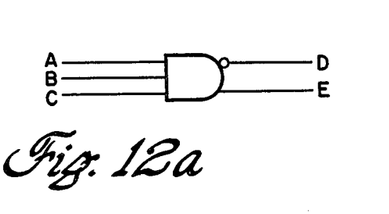
Figure 12B:
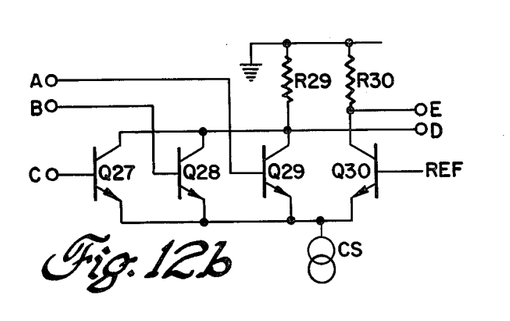

FIG. 12a shows the logic symbol for a three input NAND gate having a true output e and a complementary output D. The true output E of the NAND gate is a logical 1 whenever any of the inputs is a logical 0, and the true output E becomes a logical 0 only when all three inputs are logical 1's. The equivalent electrical circuit is shown in FIG. 12b wherein the emitter outputs of transistors Q27–Q30 are all tied to current source CS, the collector junctions of transistors Q27–Q29 are connected to ground through resistors R29, and the collector junction of transistor Q30 is connected to ground through resistor R30. The C, B and A inputs are connected to the bases of transistors Q27, Q28 and Q29, respectively. The D output is tied to the common junction of the collector of transistor Q29 and resistor R29. The E output is connected to the common junction of the collector of transistor Q30 and resistor R30.

Figure 13A:
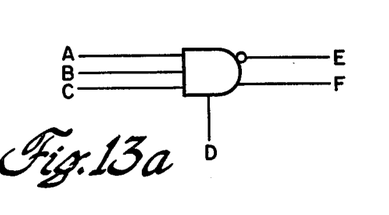
Figure 13B:
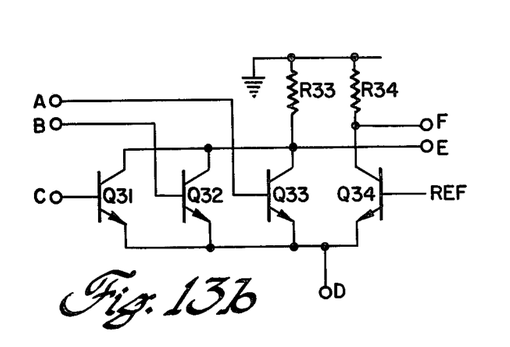

FIG. 13a illustrates the logic symbol for upper-level gate having inputs A and B of opposite polarity and an enabling input C. Output D is of the same polarity as input A, and output E has the polarity of input B. Referring to the equivalent schematic of FIG. 13b, input A is applied to the base of transistor Q17, input B is applied to the base of transistor Q18, input C is applied the common terminal of the emitters of transistors Q17 and Q18, output D is taken from the junction of resistor R18 and the collector of transistor Q18, and output E is taken from the junction of resistor R17 and the collector of transistor Q17.

Figure 14A:
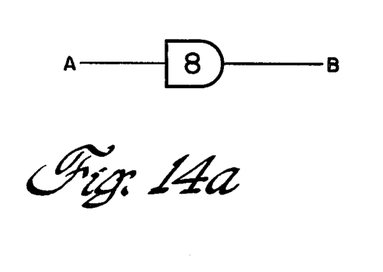
Figure 14B:
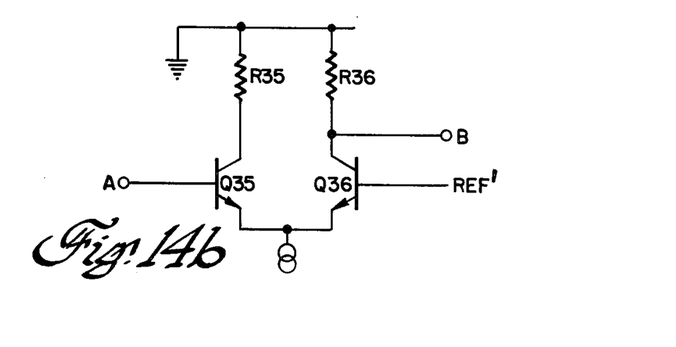

FIG. 14a illustrates the symbol for a voltage translator circuit. FIG. 14b illustrates the equivalent electrical circuit, wherein input A is applied to the base of transistor Q31, and output B is taken at the common terminal of resistor R32 and the collector of transistor Q32. The reference voltage REF' applied to the base of transistor Q32 differs from the normal reference voltage REF.

With these basic functional circuit elements in mind, defined by the logic symbols illustrated in FIGS. 5a–14a and the equivalent electrical schematics illustrated in FIGS. 5b–14b, we will now consider the overall architecture of the current mode binary/binary coded decimal arithmetic logic unit of the present invention as illustrated in FIGS. 2A–2C, 3A, and 3B.

Figure 2A:
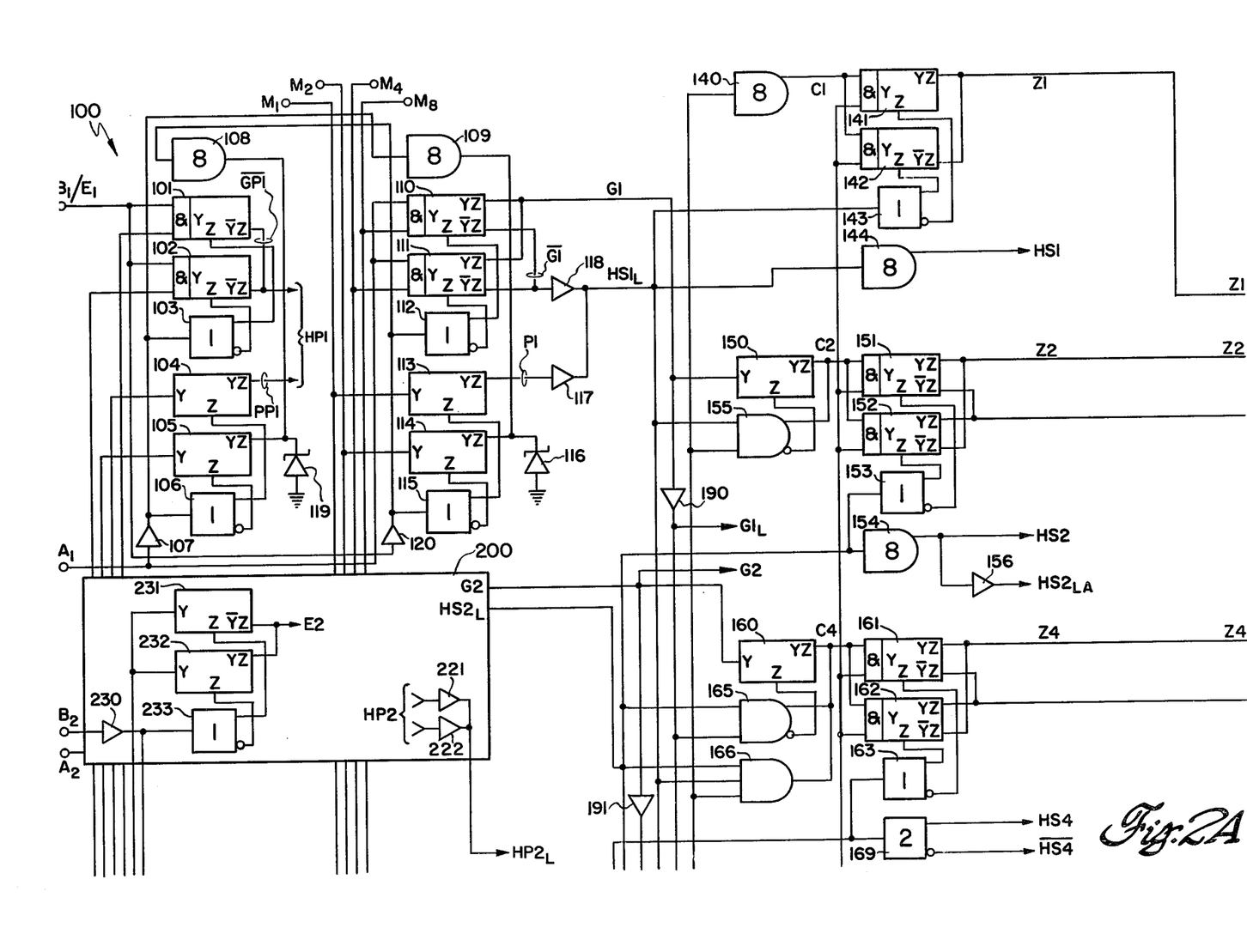
FIGS. 2A, 2B and 2C show a combination block/circuit diagram illustrating a portion of a preferred embodiment of the current mode binary/binary coded decimal arithmetic logic unit with parity of the present invention.
Figure 2B:
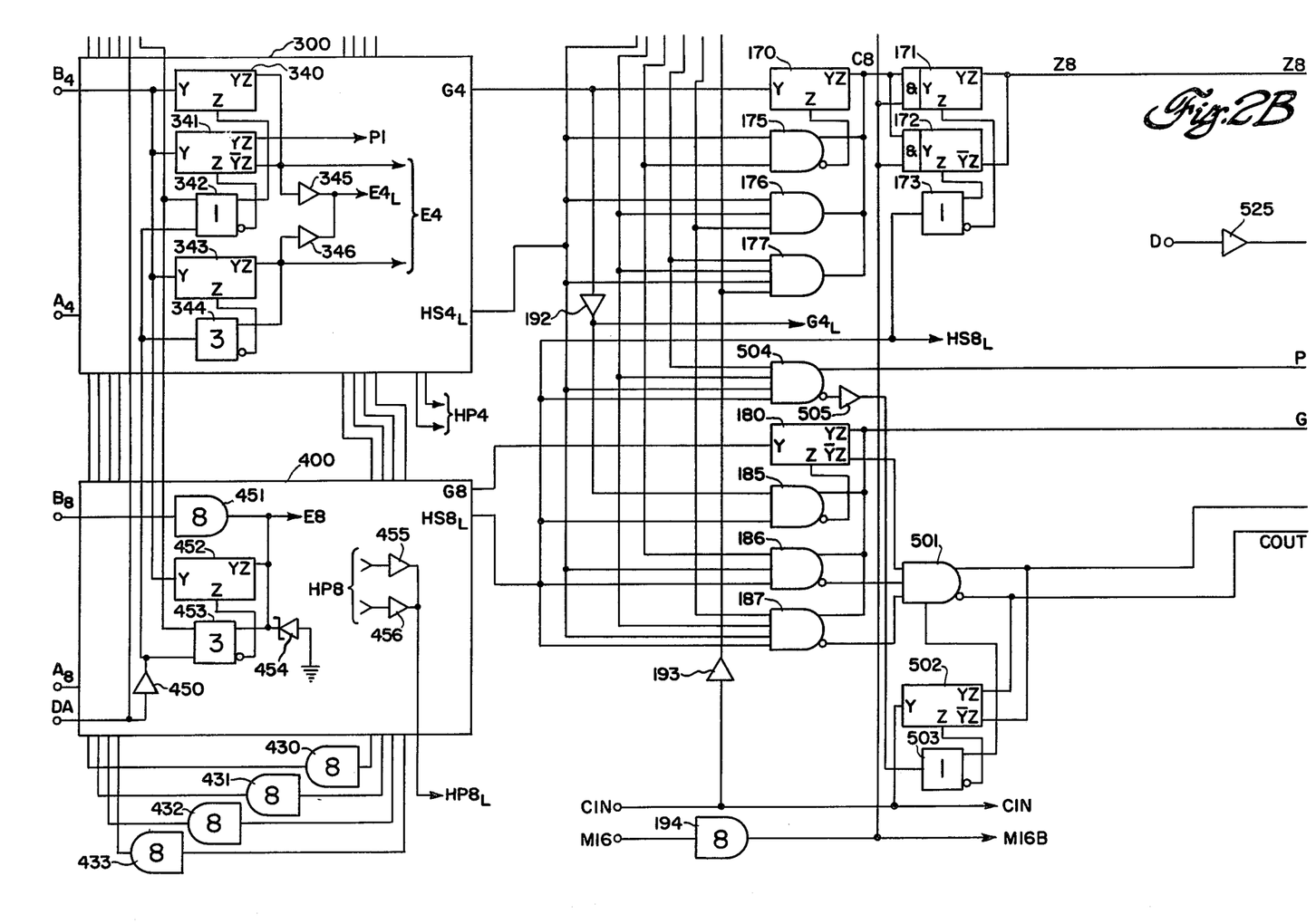
Figure 2C:
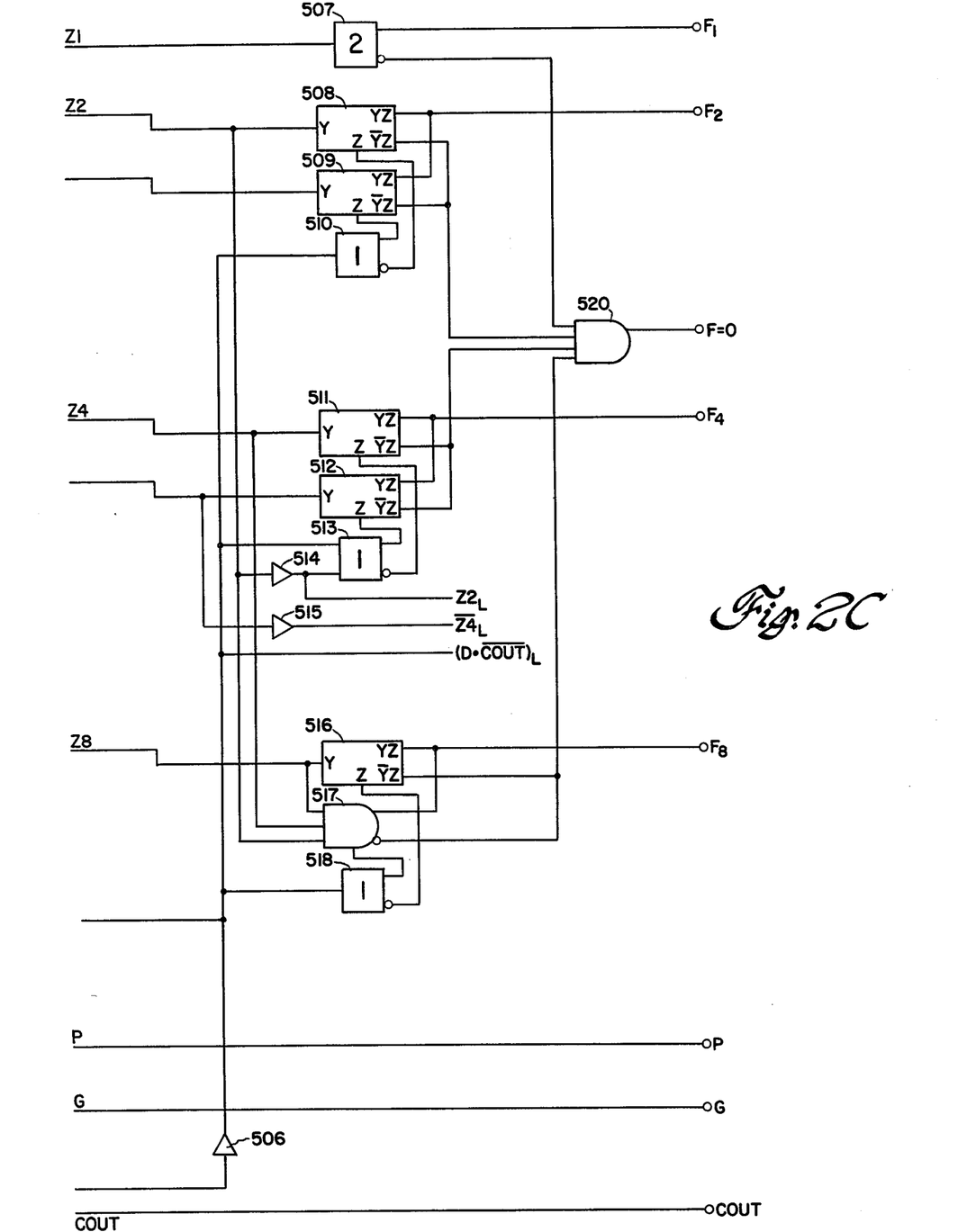

FIGS. 2A–2C show a combination block/circuit diagram illustrating that portion of a preferred embodiment of the present invention which generates the binary output F1–F8, the F=0 output, the propogate P and generate G outputs, and the carry-out output COUT. The detailed circuitry illustrated in FIGS. 2A–2C also serve to generate a number of intermediate-level signals, which signals are used as inputs to the circuitry shown in FIGS. 3A and 3B.

Figure 3A:
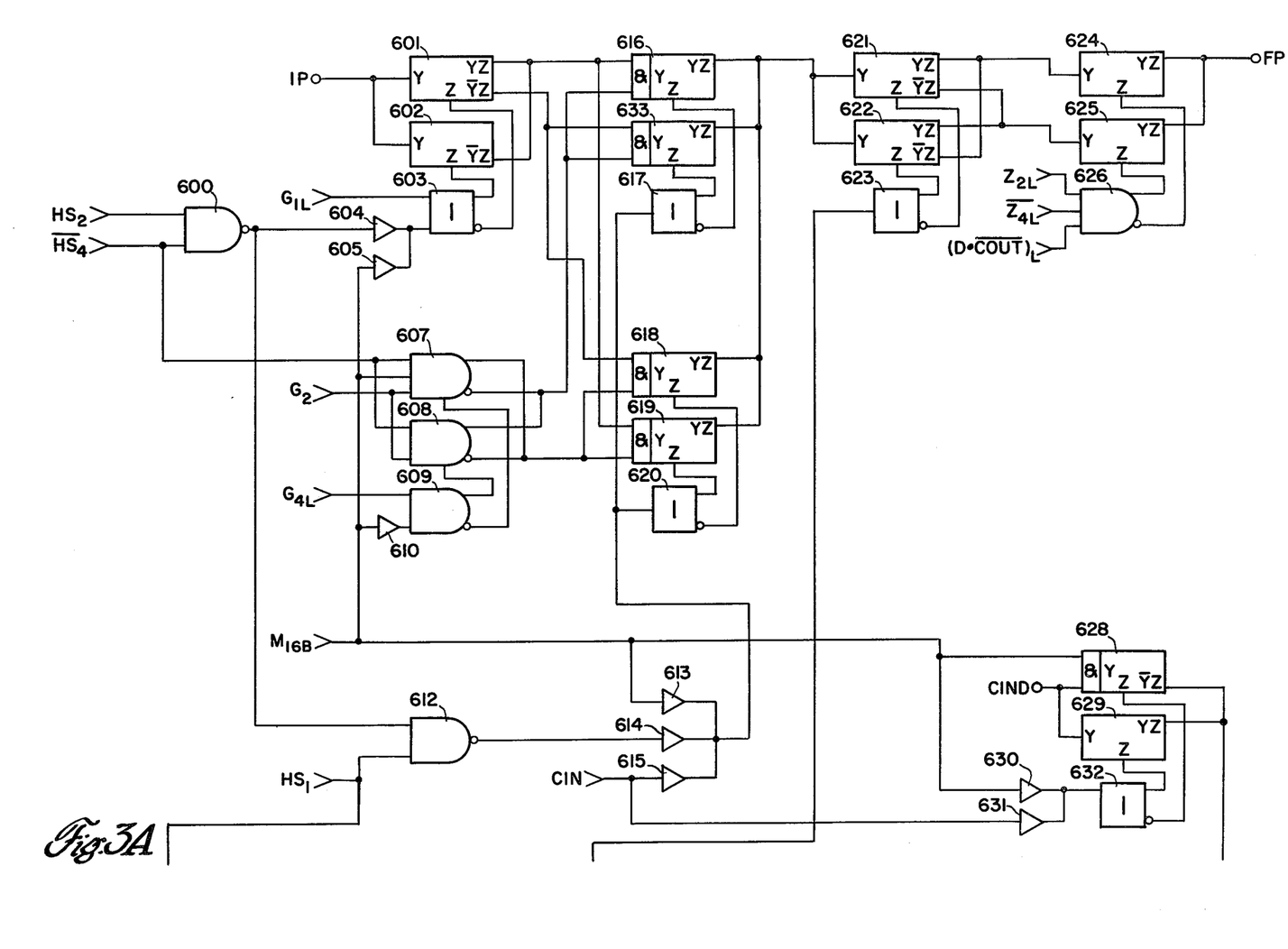
FIGS. 3A and 3B show a combination block/circuit diagram illustrating another portion of a preferred embodiment of the improved current mode binary/binary coded decimal arithmetic logic unit with parity of the present invention.
Figure 3B:
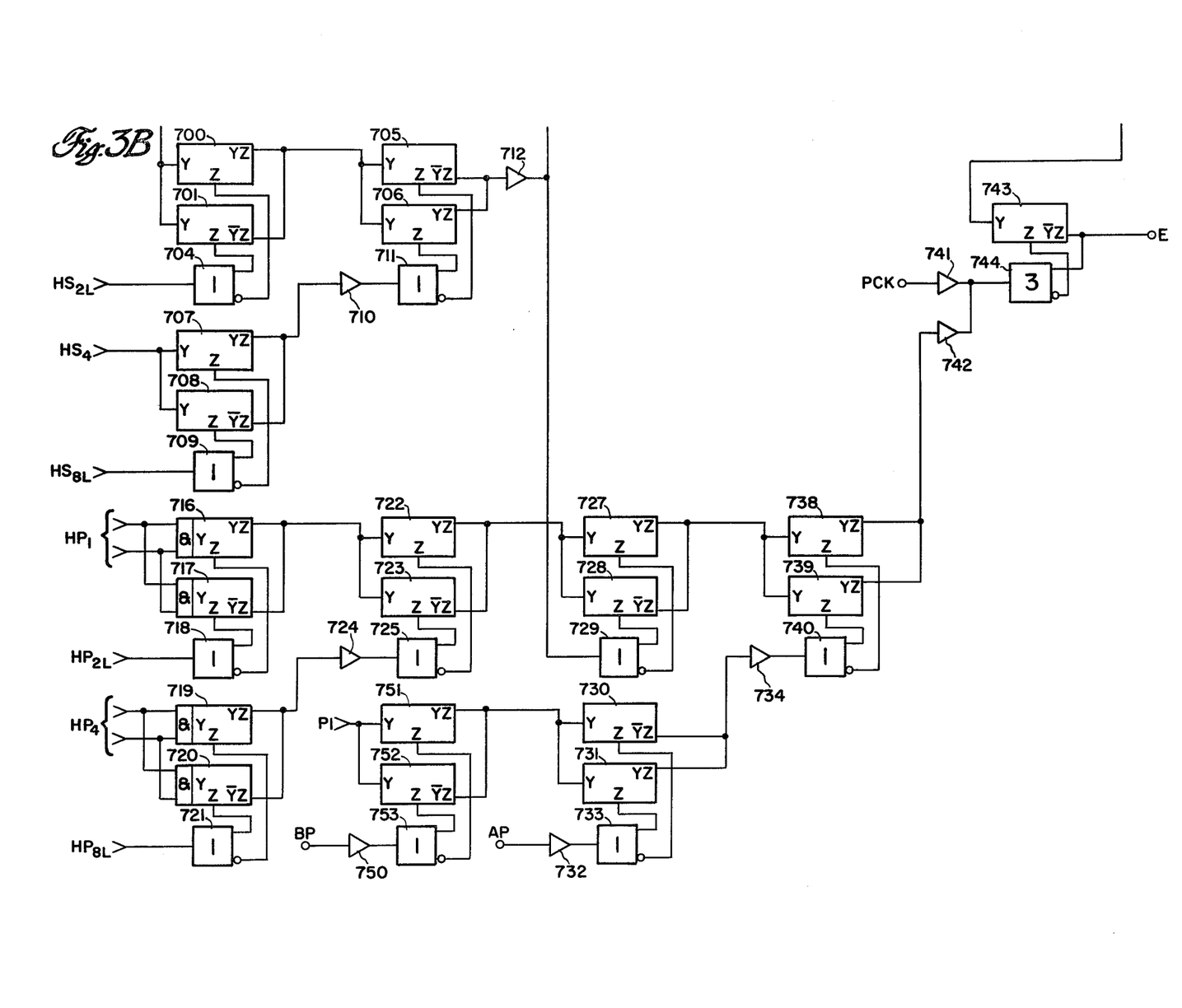

FIGS. 3A and 3B show a combination block/circuit diagram illustrating another portion of the preferred embodiment of the present invention, which circuitry serves to generate the binary output parity bit FP and the error signal E. The circuitry shown in FIGS. 3A and 3B also receive as inputs the AP and BP parity bits from the A and B input fields, respectively.

With reference now specifically to FIGS. 2A and 2B, it will be seen that the A1 and B1 input bits are transmitted into the circuit portion shown generally by reference numeral 100. Correspondingly, bits A2 and B2 are transmitted into circuit portion 200. Bits A4 and B4 are transmitted into circuit portion 300. Bits A8 and B8 are transmitted into circuit portion 400. Circuit portion 400 also receives as an input the decimal addition control signal DA. Circuit portions 100–400 all receive as additional inputs the mode control signals M1–M8 shown in the uppermost portion of FIG. 2A. The deciaml mode signal D is transmitted into emitter follower 505 in the right-hand portion of FIG. 2B. The carry-in signal CIN and mode control signal M16 are received at the terminals shown in the lower-most portion of FIG. 2B.

The interconnected circuit elements shown in FIGS. 2A–2C operate on the B inputs B1–B8 in accordance with the following logic equations and state table:

Corrected B Operand Intermediate Signals (Ei)

$E1 = B1$ $E2 = \overline{DA} \cdot (B2) + DA \cdot (\overline{Bs})$ $E4 = \overline{DA} \cdot (B4) + DA \cdot (B4 \cdot B2 + \overline{Br} \cdot \overline{b27})$ $E8 = \overline{DA} \cdot (B8) + DA \cdot (B8 + B4 + B2)$

| DA₂ | B₁₀ | E | Notes |
|---|---|---|---|
| 0 | 00 , . , 15 | B | Logic, Binary Arithmetic, Decimal Substract Functions |
| 1 | 00 , . , 09 | B plus 6 | Decimal Add Function |
| 1 | 10 , . , 15 | B minus 2 | Not Valid |

The various intermediate-level signals in the form of the half-sum HS$i$, half-parity HP$i$, carry propogate P$i$, parity propogate PP$i$, carry generate G$i$, and parity generate GP$i$ signals and generated in accordance with the following logic equations and state table:

Half Sum, Half Parity, Propagates, and Generates Intermediate Signals (HSi, HPi, Pi, PPi, Gi, GPi)

for $i = 1, 2, 4, 8$
$Gi = M8 \cdot Ai \cdot Ei + M4 \cdot Ai \cdot \overline{Ei}$    $GPi = M8 \cdot Ei \cdot Ai + M1 \cdot Ei \cdot \overline{Ai}$ $Pi = Ai + M2\overline{Ei} + M1 \cdot Ei$    $PPi = Ei + M2 \cdot \overline{Ai} + M4 \cdot Ai$
$HSi = \overline{Gi} \cdot Pi$    $HPi = \overline{Gpi} \cdot PPi$

| M8 | M4 | M2 | M1 | HSi | HPi |
|---|---|---|---|---|---|
| 0 | 0 | 0 | 0 | Ai | Ei |
| 0 | 0 | 0 | 1 | Ai + Ei | Ai . Ei |
| 0 | 0 | 1 | 0 | Ai + $\overline{Ei}$ | $\overline{Ai}$ + Ei |
| 0 | 0 | 1 | 1 | 1 | Ai ⊕ Ei |
| 0 | 1 | 0 | 0 | Ai . Ei | Ai + Ei |
| 0 | 1 | 0 | 1 | Ei | Ai |
| 0 | 1 | 1 | 0 | Ai $\overline{\oplus}$ Ei | 1 |
| 0 | 1 | 1 | 1 | $\overline{Ai}$ + Ei | Ai + $\overline{Ei}$ |
| 1 | 0 | 0 | 0 | Ai . $\overline{Ei}$ | Ai . Ei |
| 1 | 0 | 0 | 1 | Ai ⊕ Ei | 0 |
| 1 | 0 | 1 | 0 | $\overline{Ei}$ | $\overline{Ai}$ |
| 1 | 0 | 1 | 1 | Ai + $\overline{Ei}$ | $\overline{Ai}$ . $\overline{Ei}$ |
| 1 | 1 | 0 | 0 | 0 | Ai ⊕ Ei |
| 1 | 1 | 0 | 1 | $\overline{Ai}$ . Ei | Ai . $\overline{Ei}$ |
| 1 | 1 | 1 | 0 | $\overline{Ai}$ . Ei | $\overline{Ai}$ + $\overline{Ei}$ |
| 1 | 1 | 1 | 1 | $\overline{Ai}$ | $\overline{Ei}$ |

The carry intermediate signals C$i$ are generated in accordance with the following logic equations:

Carry Intermediate Signals (Ci)

$C1 =$ CIN
$C2 =$ G1 + HS1 . CIN
$C4 =$ G2 + HS2 . G1 + HS2 . HS1 . CIN
$C8 =$ G4 + HS4 . G2 + HS4 . HS2 . G1 + HS4 . HS2 . HS1 . CIN

The function intermediate signals Z$i$ are generated in accordance with the following logic equation:

Function Intermediate Signals (Zi)

for $i = 1, 2, 4, 8$
$Zi =_0 HSi \oplus (Ci.M16)$ $\overline{Zi} = [\overline{HSi \oplus (Ci.M16)}]$ The function output signals F$i$ are generated in accordance with the following logic equations and state table:

Function Output Signals (Fi)

$F1 = Z1$ $F2 = Z2 \oplus (\overline{COUT} \cdot D)$ $F4 = Z4 \oplus (Z2 \cdot \overline{COUT} \cdot D)$ $F8 = [Z8 \cdot (COUT + \overline{D})] + [Z8 \cdot Z4 \cdot Z2 \cdot \overline{COUT} \cdot D]$

| D | C16, Z | F | Notes |
|---|---|---|---|
| 0 | 00 … 31 | Z | Logic or Binary Arithmetic Functions |
| 1 | 16 … 31 | Z | Decimal Add or Substract Functions |
| 1 | 6 .., 15 | Z minus 6 | |
| 1 | 0 … 5 | | Not Valid |
| 1 | 25 … 31 | | Not Valid |

The special ouputs in the form of the propagate P, generate G, carry-out COUT, and F=0 signals are generated in accordance with the following logic equations:

Special Outputs $(F=0) = \overline{F8} \cdot \overline{F4} \cdot \overline{F2} \cdot \overline{F1}$ $COUT = G8 + HS8 \cdot G4 + HS8 \cdot HS4 \cdot G2 + HS8 \cdot HS4 \cdot HS2 \cdot G1 + HS8 \cdot HS4 \cdot HS2 \cdot HS1 \cdot CIN$ $G = G8 + HS8 \cdot G4 + HS8 \cdot HS4 \cdot G2 + HS8 \cdot HS4 \cdot HS2 \cdot G1$ $P = HS8 \cdot HS4 \cdot HS2 \cdot HS1$ The resultant arithmetic and logic operations performed by the current mode binary/binary coded decimal arithmetic logic unit described above are given by the following equations and tables as a function of the 5-bit mode control signal M1–M16:

| M8 | M4 | M2 | M1 | M16 = 0 | M16 = 1 |
|---|---|---|---|---|---|
| 0 | 0 | 0 | 0 | F = A | F = A plus CIN |
| 0 | 0 | 0 | 1 | F = A + B | F = A + B plus CIN |
| 0 | 0 | 1 | 0 | F = A + $\overline{B}$ | F = A + $\overline{B}$ plus CIN |
| 0 | 0 | 1 | 1 | F = logical 1 | F = minus 1 plus CIN |
| 0 | 1 | 0 | 0 | F = A . B | F = A plus (A . $\overline{B}$) plus CIN |
| 0 | 1 | 0 | 1 | F = B | F = (A + B) plus (A . $\overline{B}$) plus CIN |
| 0 | 1 | 1 | 0 | F = A ⊕ B | F = A minus B minus 1 plus CIN (Note 1) |
| 0 | 1 | 1 | 1 | F = $\overline{A}$ + B | F = (A . $\overline{B}$) minus 1 plus CIN |
| 1 | 0 | 0 | 0 | F = A . $\overline{B}$ | F = A plug (A . B) (A.B) plus CIN |

-continued

| M8 | M4 | M2 | M1 | M16 = 0 | M16 = 1 |
|---|---|---|---|---|---|
| 1 | 0 | 0 | 1 | $F = A \oplus B$ | F = A plus B plus CIN (Note 2) |
| 1 | 0 | 1 | 0 | $F = \overline{B}$ | $F = (A + \overline{B})$ plus (A, B) plus CIN |
| 1 | 0 | 1 | 1 | $F = \overline{A} + \overline{k}\overline{B}$ | F = (A, B) minus 1 plus CIN |
| 1 | 1 | 0 | 0 | F = 0 logical 0 | F = A plus A plus CIN |
| 1 | 1 | 0 | 1 | $F = \overline{A} \cdot B$ | F = (A + B) plus A plus CIN |
| 1 | 1 | 1 | 0 | $F = \overline{A} \cdot \overline{B}$ | $F = (A + \overline{B})$ plus A plus CIN |
| 1 | 1 | 1 | 1 | $F = \overline{A}$ | F = A minus 1 plus CIN |

Note 1: Decimal subtract if $A \leq 9$, $B \leq 9$, $D = 1$
Note 2: Decimal add if $A \leq 9$, $B \leq 9$, $DA = 1$, $D = 1$ With reference now in particular to FIGS. 3A and 3B, it will be seen that such circuitry receives as inputs the various intermediate level signals generated by the circuitry shown and described above with regard to FIGS. 2A–2C. In addition, the circuitry in FIGS. 3A and 3B receives as inputs the invert parity input IP, which is transmitted to the Y input of upper level gate 601, the parity check input PCK which is applied to emitter follower 741, the carry-in duplicate signal CIND which is applied as an input to upper level gate 628, and the parity bits AP and BP associated with the A and B input fields, respectively, and which are transmitted to emitter followers 732 and 750, respectively. The circuitry shown in FIGS. 3A and 3B generates the binary output predicted parity bit FP and the output error signal E.

The interconnected elements of FIGS. 3A and 3B operate on the designated intermediate-level inputs and the aforementioned basic inputs to generate the binary output predicted parity bit FP in accordance with the following logic equations:

Parity Output (FP)

$FP = ZP \oplus (\overline{Z4} \cdot Z2 \cdot D \cdot \overline{COUT})$ $ZP = \{CIN \cdot [\overline{HS1} + (HS2 \cdot \overline{HS4})] \cdot M16\}$ $\oplus \{G1 \cdot (\overline{HS2} + HS4) \cdot M16\}$ $\oplus \{G2 \cdot \overline{HS4} \cdot M16\}$ $\oplus \{G4 \cdot M16\}$ $\oplus \{IP\}$ $\oplus \{\overline{HS1} \oplus \overline{HS2} \oplus \overline{HS4} \oplus \overline{HS8}\}$ The error output E is generated in accordance with the following logic equations:

Error Output (E)

Figure 4:
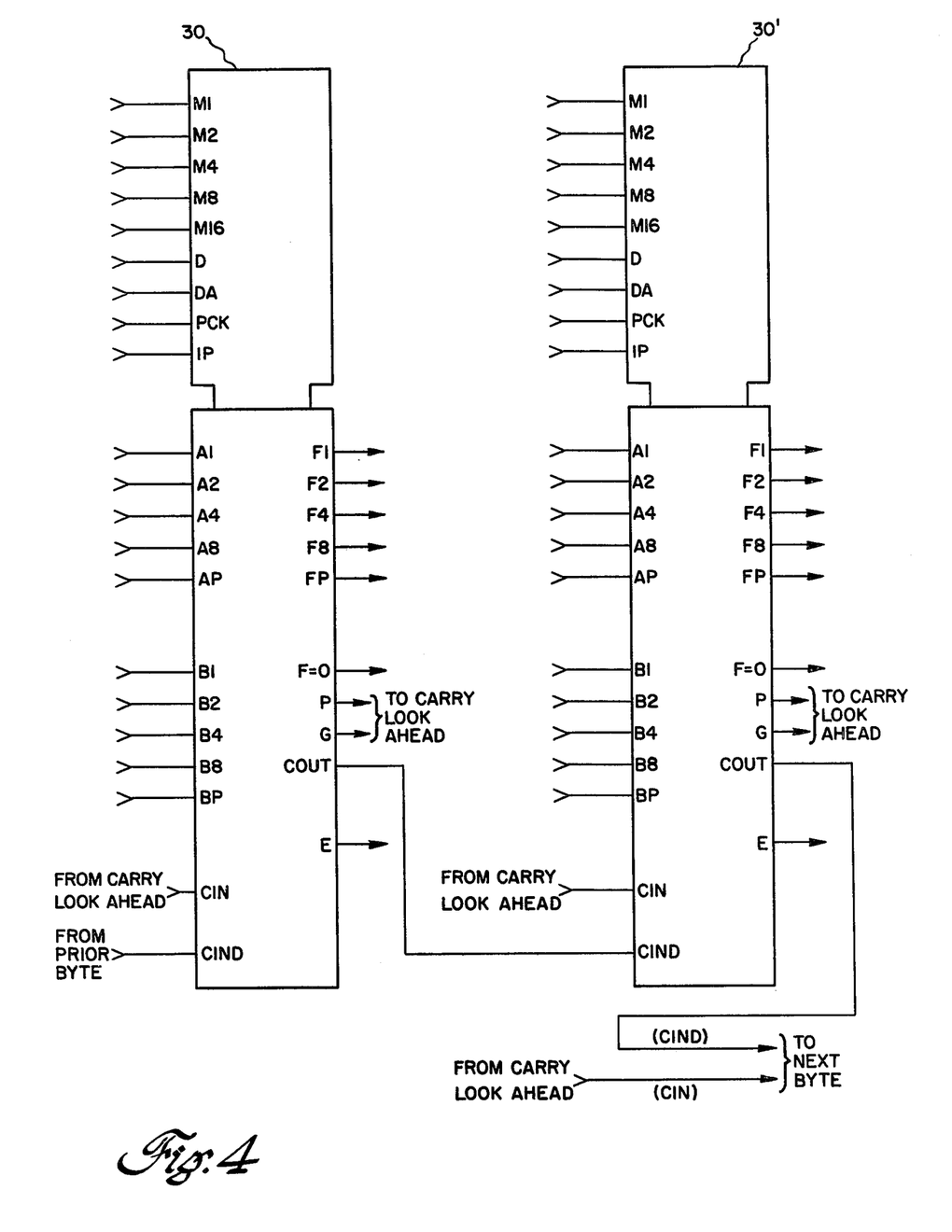
FIG. 4 represents a typical implementation of the current mode binary/binary coded decimal arithmetic logic unit with parity in a dual byte configuration.

$E = \{(CIND \oplus CIN) \cdot M16\} + \{[\overline{AP \oplus BP \oplus (DA \cdot B4 \cdot B2)}]$ $\oplus [\overline{HS1} \oplus \overline{HS2} \oplus \overline{HS4} \oplus \overline{HS8}]$ $\oplus [HP1 \oplus HP2 \oplus HP4 \oplus HP8]\} \cdot PCK$ FIG. 4 illustrates a typical implementation of the current mode binary/binary coded decimal arithmetic logic unit with parity in a configuration which is operative on two bytes of data. Devices 30 and 30' are interconnected as shown to perform the designed arithmetic and logic operations, including the parity prediction, parity checking, and carry checking operations on two bytes of data. The carry look-ahead circuit referred to in FIG. 4 may be that substantially shown and described in Related Invention No. 1. If devices 30 and 30' are operating on two and only two bytes of data, the CIN and CIND inputs into device 30 are tied together unless it is desired to provide an alternate duplicate carry-in CIND'.

When operating in the arithmetic mode, the duplicate carry-in input CIND is driven by the carry-out COUT of the prior byte and is compared with the carry-in input CIN from the associated carry look-ahead circuit to detect carry burst errors. When operating in the Boolean mode, this check is disabled.

It will be apparent to those skilled in the art that the disclosed current mode binary/binary coded decimal arithmetic logic unit with parity may be modified in numerous ways and may assume many embodiments other than that specifically set out and described above.

Accordingly, it is intended by the appended claims to cover all modifications of the invention which fall within the true spirit and scope of the invention.

What is claimed is:

1. A current mode binary/binary coded decimal arithmetic logic unit for performing a repertoire of operations on pure binary and on binary coded decimal data and for performing parity prediction, parity checking, and carry checking operations, said arithmetic logic unit comprising:
   a first portion for receiving first and second binary signal inputs A$i$ and B$i$, a carry input CIN, a decimal mode signal D, a decimal add signal DA, and a mode control signal M1–M16, said first portion generating a binary output resultant F$i$ of the operation defined by said mode control signal, said first portion further generating a plurality of intermediate-level signals, a propagate signal P, a generate signal G, and a carry-out signal COUT,
   a second portion receiving said intermediate-level signals, and further receiving a carry-in duplicate signal CIND, an invert parity signal IP, and a parity check signal PCK, said second portion generating a parity prediction signal FP representing the predicted state of a binary output parity bit FP and further generating an error signal E in the event that an error occurs in the generation of said carry-out signal COUT or said parity prediction signal FP.

2. The current mode binary/binary coded decimal arithmetic logic unit as recited in claim 1 wherein said first portion generates said intermediate-level signals in accordance with the following tables:
   Function Intermediate Signals (Z$i$):
   for $i = 1, 2, 4, 8$
   $Zi = HSi \oplus (Ci \cdot M16)$ $\overline{Zi} = [\overline{HSi \oplus (Ci \cdot M16)}]$ Corrected B Operand Intermediate Signals (E$i$):
  $E1 = B1$
  $E2 = \overline{DA}.(B2) + DA.(\overline{B2})$
  $E4 = \overline{DA}.(B4) + DA.(B4.B2 + \overline{B4.B2})$
  $E8 = \overline{DA}(B8) + DA.(B8 + B4 + B2)$ Half Sum, Half Parity, Propagates, and Generates Intermediate Signals (HS$i$, HP$i$, P$i$, PP$i$, G$i$, GP$i$: for $i = 1, 2, 4, 8$ $Gi = M8.Ai.Ei + M4.Ai.\overline{Ei}$ $GPi = M8.Ei.Ai + M1.Ei.\overline{Ai}$ $Pi = Ai + M2.\overline{Ei} + M1.Ei$ $PPi = Ei + M2.\overline{Ai} + M4.Ai$ $HSi = \overline{Gi}.Pi$ $HPi = \overline{GPi}.PPi$

| M8 | M4 | M2 | M1 | HS$i$ | HP$i$ |
|---|---|---|---|---|---|
| 0 | 0 | 0 | 0 | A$i$ | E$i$ |
| 0 | 0 | 0 | 1 | A$i$ + E$i$ | A$i$ . E$i$ |
| 0 | 0 | 1 | 0 | A$i$ + $\overline{Ei}$ | $\overline{Ai}$ + E$i$ |
| 0 | 0 | 1 | 1 | 1 | A$i$ $\overline{\oplus}$ E$i$ |
| 0 | 1 | 0 | 0 | A$i$ . E$i$ | A$i$ + E$i$ |
| 0 | 1 | 0 | 1 | E$i$ | A$i$ |
| 0 | 1 | 1 | 0 | A$i$ $\oplus$ E$i$ | 1 |
| 0 | 1 | 1 | 1 | $\overline{Ai}$ + E$i$ | A$i$ + $\overline{Ei}$ |
| 1 | 0 | 0 | 0 | A$i$ . $\overline{Ei}$ | $\overline{Ai}$ . E$i$ |
| 1 | 0 | 0 | 1 | A$i$ $\oplus$ E$i$ | 0 |
| 1 | 0 | 1 | 0 | $\overline{Ei}$ | $\overline{Ai}$ |
| 1 | 0 | 1 | 1 | $\overline{Ai}$ + $\overline{Ei}$ | $\overline{Ai}$ . $\overline{Ei}$ |
| 1 | 1 | 0 | 0 | 0 | A$i$ $\oplus$ E$i$ |
| 1 | 1 | 0 | 1 | $\overline{Ai}$ . E$i$ | A$i$ . $\overline{Ei}$ |
| 1 | 1 | 1 | 0 | A$i$ . E$i$ | A$i$ + E$i$ |
| 1 | 1 | 1 | 1 | $\overline{Ai}$ | $\overline{Ei}$ |

Carry Intermediate Signals (C$i$):

$C1 = $ CIN
$C2 = G1 + HS1.CIN$
$C4 = G2 + HS2.G1 + HS2.HS1.CIN$
$C8 = G4 + HS4.HS2.G1 + HS4.HS2.HS1.CIN + HS4.G2 + G2$ wherein said second portion generates said parity prediction signal FP in accordance with the following table:

Parity Output (FP):

$Fp = ZP \oplus (\overline{Z4}.Z2.D.\overline{COUT})$ $ZP = \{CIN.[\overline{HS1} + (HS2.\overline{HS4})].M16\}$ $\oplus \{G1.(\overline{HS2} + HS4).M16\}$ $\oplus \{G2.\overline{HS4}.M16\}$ $\oplus \{G4.M16\}$ $\oplus \{IP\}$ $\oplus \{\overline{HS1} \oplus HS2 \oplus HS4 \oplus HS8\}$ and wherein said second portion generates said error signal E in accordance with the following table:

Error Output (E):

$E = \{(CIND \oplus CIN).M16\} + \{[\overline{AP} \oplus \overline{BP} \oplus \overline{(DA.B4.\overline{B2})}]$ $\oplus [\overline{HS1} \oplus HS2 \oplus HS4 \oplus HS8]$ $\oplus [HP1 \oplus HP2 \oplus HP4 \oplus HP8]\}.PCK$

* * * * *